United States Patent [19]

Han

[11] Patent Number: 5,799,678
[45] Date of Patent: Sep. 1, 1998

[54] APPARATUS FOR CLEANSING SEMICONDUCTOR WAFER

[75] Inventor: Suk-Bin Han, Choongcheongbuk-Do, Rep. of Korea

[73] Assignee: LG Semicon Co., Ltd., Choongcheongbuk-Do, Rep. of Korea

[21] Appl. No.: 769,071

[22] Filed: Dec. 18, 1996

[30] Foreign Application Priority Data

Dec. 19, 1995 [KR] Rep. of Korea .................. 1995 51996

[51] Int. Cl.⁶ .................................................. B08B 3/04
[52] U.S. Cl. ........................ 134/104.1; 134/104.4; 134/902; 134/155; 134/186; 134/109; 134/201
[58] Field of Search ........................ 134/902, 201, 134/56 R, 155, 186, 111, 105, 104.1, 109, 104.4

[56] References Cited

U.S. PATENT DOCUMENTS

| 4,325,394 | 4/1982 | Reams | 134/902 |
|---|---|---|---|
| 4,669,612 | 6/1987 | Mortensen | 134/902 |
| 5,261,431 | 11/1993 | Ueno et al. | 134/902 |
| 5,370,142 | 12/1994 | Nishi et al. | 134/61 |
| 5,474,616 | 12/1995 | Hayami et al. | 134/902 |
| 5,540,247 | 7/1996 | Kawatani et al. | 134/902 |

FOREIGN PATENT DOCUMENTS

| 59-134834 | 8/1984 | Japan | 134/902 |
|---|---|---|---|
| 3-232228 | 10/1991 | Japan | 134/902 |
| 3-250732 | 11/1991 | Japan | 134/902 |
| 4-58529 | 2/1992 | Japan | 134/902 |
| 4-75341 | 3/1992 | Japan | 134/902 |
| 6-89889 | 3/1994 | Japan | 134/902 |

OTHER PUBLICATIONS

High Effective Rinse by Down Flow Bath System, Y. Hiratsuka et al., 24th Symposium On ULSI Ultra Clean Technology, Mar. 7–8, 1995, pp. 93–95.

Primary Examiner—Frankie L. Stinson
Attorney, Agent, or Firm—Morgan, Lewis and Bockius LLP

[57] ABSTRACT

An improved apparatus for cleansing a semiconductor wafer which is capable of effectively removing the foreign substances from the wafer mounting grooves formed in the boats and the outer surface of the boat, for thus enhancing the reliability of the products. The apparatus includes an outer tub having a first cleansing liquid supply tube for supplying a cleansing liquid therethrough and a discharge tube for discharging the cleansing liquid therethrough, an inner tub disposed within the outer tub, a baffle plate disposed within the inner tub for distributing the cleansing liquid supplied to a wafer, a boat disposed on the baffle plate, on which boat a wafer is mounted, a foreign substance extraction tube disposed in a wafer support position of the boat for introducing the foreign substances formed in the interior of the inner tub thereinto and for discharging the same to the outside, and a second cleansing liquid supply tube for supplying the cleansing liquid to the foreign substance extraction tube.

11 Claims, 3 Drawing Sheets

APPARATUS FOR CLEANSING SEMICONDUCTOR WAFER

BACKGROUND OF THE INVENTION

1. Field of the Invention

The present invention relates to an apparatus for cleansing a semiconductor wafer, and in particular to an improved apparatus for cleansing a semiconductor wafer which is capable of disposing a foreign substance extraction tube on a boat on which a wafer is mounted and discharging the foreign substances removed from the wafer and the boat to the outside of an inner tub, for thus preventing the wafer, which is being cleansed, from being polluted, whereby it is possible to increase the cleansing effects of the system.

2. Description of the Conventional Art

As a high integration semiconductor device is made, fine particles on the surface of the wafer may cause a critical damage to the characteristic of the device.

Therefore, recently, the cleansing technique is considered to be the most important technique in the industry so as to effectively cleanse the fine particles on the surface of the wafer.

In the LSI technique, a semiconductor device of 2 μm is actually used in the industry. When fabricating such semiconductor devices, a cleansing technique for maintaining an ultra-environment is necessary in the fabrication process of the high integration semiconductor device.

Therefore, as the wafer is made larger, and the chip size is made smaller, a new cleansing apparatus has been developed. In particular, a technique for reducing the cleansing liquid (or a cleansing water) provided into the cleansing tub has been intensively studied.

FIG. 1 is a schematic view illustrating the construction of a conventional semiconductor wafer cleansing apparatus, and FIG. 2 is a perspective view illustrating a wafer mounted on a boat of a conventional semiconductor wafer cleansing apparatus.

As shown therein, an inner tub 2 is disposed within an outer tub 1 having a supply tube 1a for supplying a cleansing liquid therethrough and a discharge tube 1b for discharging the cleansing liquid therethrough. A baffle plate 3 is disposed in the bottom portion of the inner tub 2 for controlling the flowing amount of the cleansing liquid supplied to the inner tub 2 through the supply tube 1a. A boat 4 is disposed on the baffle plate 3 for mounting a wafer "W" thereon.

In addition, there are further provided a pump 6 disposed in the supply tube 1a for pumping the cleansing liquid, a valve 7 for controlling the flowing of the cleansing liquid, and a filter 8 for filtering foreign substances from the cleansing liquid, for thus purifying the cleansing liquid.

The operation of the conventional wafer cleansing apparatus will now be explained with reference to the accompanying drawings.

First, the wafer "W" to be cleansed is moved into the inner tub 2 by using a wafer chuck (not shown) and is mounted on the boat 4.

Thereafter, the cleansing liquid is supplied into the inner tub 2 through the supply tube 1a one end of which is connected to the inner tub 2. Here, the amount of the cleansing liquid is controlled by the baffle plate 3. The cleansing liquid introduced into the inner tub 2 cleanses the wafer "W" mounted on the boat 4.

In addition, when the cleansing liquid is filled in the inner tub 2, and then is over-flown toward the outer tub 1 beyond the upper edge of the inner tub 2. The thusly over-flown cleansing liquid is gathered at the bottom portion of the outer tub 1. The thusly gathered cleansing liquid is circulated into the inner tub 2 after the flowing amount is controlled by the valve 7, and the filtering is performed by the filter 8 in cooperation with the pump 8. If the cleansing liquid is polluted by a predetermined level, the cleansing liquid is discharged to the outside as waste.

The above-described conventional semiconductor wafer cleansing apparatus was disclosed in U.S. Pat. No. 5,370,142 (Nov. 6, 1994) and "24th Symposium on ULSI (Ultra Clean Technology, Japan)".

However, the conventional semiconductor wafer cleansing apparatus, as shown in FIG. 3, has disadvantages in that foreign substances are formed in a plurality of mounting grooves 4a formed in the boat 4 for mounting the wafer "W" on the boat 4, and the thusly formed foreign substances are increased and may degrade the reliability of the products.

Namely, in the case of the fixed boat type, the foreign substances are increasingly gathered in the mounting grooves 4a and may pollute the wafer "W", and in the case of a movable boat type, the foreign substances are increasingly gathered in the mounting grooves 4a, and then in a state the foreign substances are attached to the boat 4, the foreign substances are moved into the cleansing apparatus, thus polluting the wafer "W".

SUMMARY OF THE INVENTION

Accordingly, it is an object of the present invention to provide an apparatus for cleansing a semiconductor wafer which overcomes the problems encountered in the conventional art.

It is another object of the present invention to provide an improved apparatus for cleansing a semiconductor wafer which is capable of effectively removing the foreign substances from the wafer mounting grooves formed in the boats and the outer surface of the boat, thus enhancing the reliability of the products.

To achieve the above objects, there is provided an apparatus for cleansing a semiconductor wafer which includes an outer tub having a first cleansing liquid supply tube for supplying a cleansing liquid therethrough and a discharge tube for discharging the cleansing liquid therethrough, an inner tub disposed within the outer tub, a baffle plate disposed within the inner tub for distributing the cleansing liquid supplied to a wafer, a boat disposed on the baffle plate, on which boat a wafer is mounted, a foreign substance extraction tube disposed in a wafer support position of the boat for introducing the foreign substances formed in the interior of the inner tub thereinto and for discharging the same to the outside, and a second cleansing liquid supply tube for supplying the cleansing liquid to the foreign substance extraction tube.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 4:
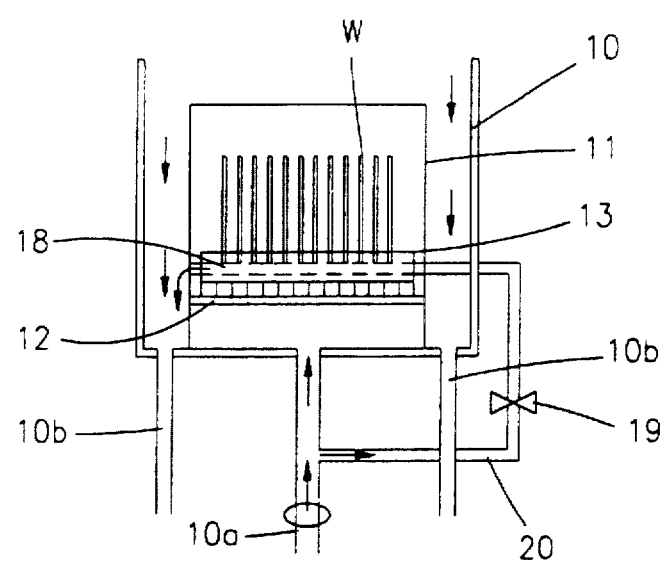
FIG. 4 is a cross-sectional view illustrating the construction of a semiconductor wafer cleansing apparatus according to the present invention.
Figure 5:
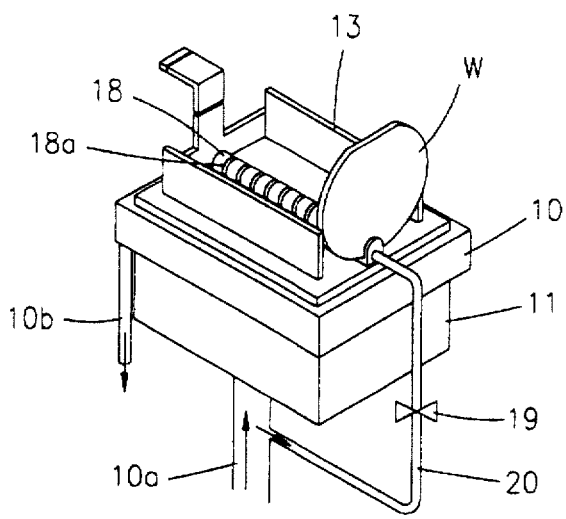
FIG. 5 is a perspective view illustrating a wafer mounted on a boat of a semiconductor wafer cleansing apparatus according to the present invention.

FIG. 4 is a cross-sectional view illustrating the construction of a semiconductor wafer cleansing apparatus according to the present invention, and FIG. 5 is a perspective view illustrating a wafer mounted on a boat of a semiconductor wafer cleansing apparatus according to the present invention.

Figure 1:
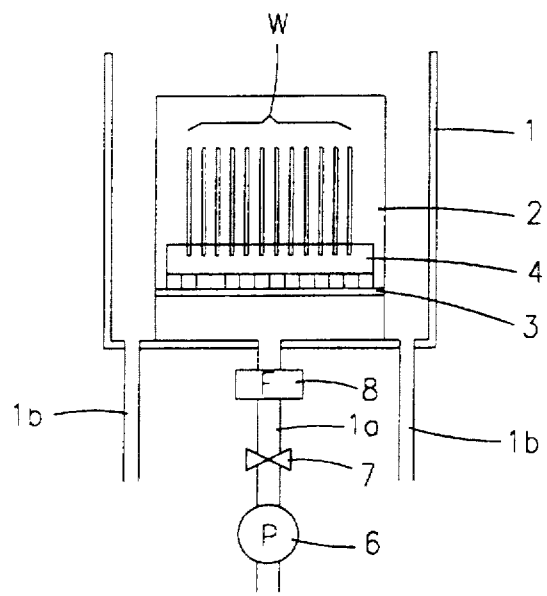
FIG. 1 is a schematic view illustrating the construction of a conventional semiconductor wafer cleansing apparatus.
Figure 2:
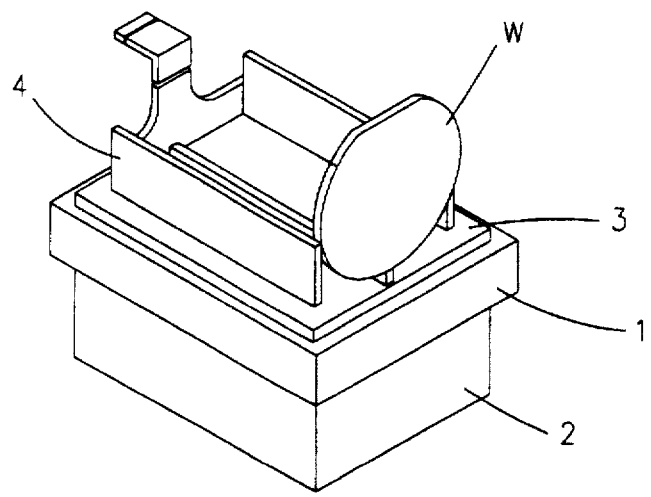
FIG. 2 is a perspective view illustrating a wafer mounted on a boat of a conventional semiconductor wafer cleansing apparatus.
Figure 3:
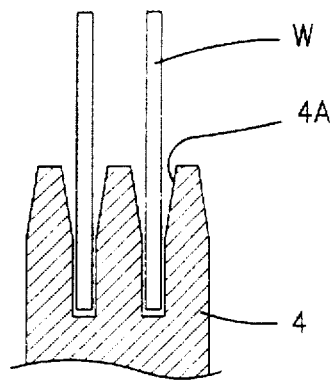
FIG. 3 is a cross-sectional view illustrating a wafer mounted in a mounting groove formed in a boat as shown in FIG. 2.

As shown therein, the semiconductor wafer cleansing apparatus according to the present invention includes an outer tub 10 to which each one end of a first cleansing liquid supply tube 10a and a discharge tube 10b are connected, respectively, and within which an inner tub 11 is disposed, a baffle plate 12 disposed in the inner tub 11 for controlling the flowing amount of the cleansing liquid supplied into the inner tub 11 through the supply tube 10a, and a boat 13 disposed on the baffle plate 12 for mounting a wafer "W" thereon. In addition, there are further provided a pump 15 disposed on the first cleansing liquid supply tube 10a for supplying the cleansing liquid into the inner tub 11, a first valve 16 for controlling the flowing of the cleansing liquid, and a filter 17 for filtering the foreign substances from the cleansing liquid. The above-described constructions are the same as the conventional semiconductor wafer cleansing apparatus as shown in FIGS. 1 and 2.

Here, the apparatus for cleansing a semiconductor wafer according to the present invention also includes a foreign substance extraction tube 18 for more effectively discharging the foreign substances formed within the inner tub 11 and removing the foreign substance from the wafer "W" to the outside with the help of a second cleansing liquid supply tube 20. The detailed descriptions will be given below.

As shown in FIGS. 4 and 5, the second cleansing liquid supply tube 20 is connected to the foreign substance extraction tube 18, separately from the first cleansing liquid supply tube 10a. The foreign substance extraction tube 18 is disposed on and supported by the boat 13 with one end connected to the second cleansing liquid supply tube 20, and the other end communicating with the interior of the outer tub 10 having the discharge tub 10b.

Figure 6A:
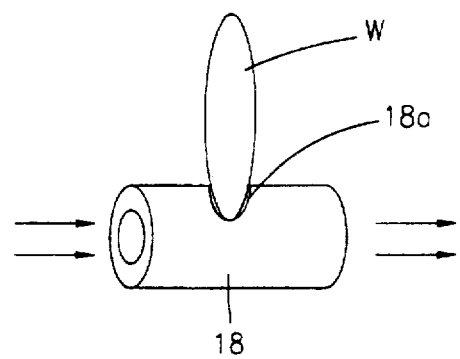
FIGS. 6A and 6B are views illustrating a foreign substance extraction tube of a semiconductor wafer cleansing apparatus according to the present invention.
Figure 6B:
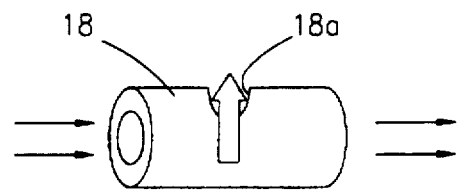

In addition, as shown in FIG. 5, a plurality of foreign substances receiving holes 18a are formed on the upper surface of the foreign substance extraction tube 18. These foreign substance receiving holes 18a, as shown in FIGS. 6A and 6B, support the lower portion of the wafer "W" mounted on the boat 13 and are formed in order for the foreign substances attached on the wafer "W" and the boat 13 to be introduced into the foreign substance extraction tube 18.

In addition, as shown in FIGS. 4 and 5, a second valve 19 is disposed in the second cleansing liquid supply tube 20 for properly controlling the flowing amount and intensity of the cleansing liquid supplied to the foreign substance extraction tube 18.

The operation of the semiconductor wafer cleansing apparatus according to the present invention will now be explained with reference to the accompanying drawings.

First, in a state that the wafer "W" is supported by the mounting grooves formed in the boat 13 and the foreign substance receiving holes 18a formed in the foreign substance extraction tube 18, when the cleansing liquid is supplied through the first cleansing liquid supply tube boa, the flowing amount of the cleansing liquid is distributed and controlled by the baffle plate 12, and is supplied to the wafer "W", thus cleansing the wafer "W" mounted on the boat 13 and the foreign substance extraction tube 18.

In addition, if the cleansing liquid is continuously supplied, the inner tub 11 is filled with the cleansing liquid. Thereafter, when the cleansing liquid is over-flown beyond the upper edge of the inner tub 11, it is gathered in the bottom portion of the outer tub 10. The thusly gathered cleansing liquid is discharged into the inner tub 11 after the flowing amount is controlled by the first valve 16, and the filtering is performed by the filter 17 in cooperation with the pump 15 disposed in the first cleansing liquid supply tube 10a. Through the above-described processes, the wafer "W" is cleansed. If the polluted level of the cleansing liquid exceeds a predetermined level, the cleansing liquid is discharged to the outside as waste.

In addition, when the wafer "W" mounted on the boat 13 and the foreign substance extraction tube 18 is cleansed, the cleansing liquid is supplied into the inner tub 11 through the foreign substance extraction tube 18 supporting the wafer "W" through the second cleansing liquid supply tube 20 spaced apart from the first cleansing liquid supply tube 10a. The foreign substances removed from the wafer "W" and the boat 13 by the thusly supplied cleansing liquid are introduced into the foreign substance receiving holes 18a and cleansed and discharged to the outside. The flowing speed of the cleansing liquid introduced into the foreign substance extraction tube 18 is controlled by the opening/closing level of the second valve 19. The second valve 19 is properly controlled so that the wafer "W" is stably supported, and the cleansing operation is stably performed.

Namely, the foreign substances gathered in the foreign substance extraction tube 18 are cleansed by the cleansing liquid, and are then discharged from the foreign substance extraction tube 18 toward the discharge tube 10b disposed in the outer tub 10, and the thusly discharged foreign substances are filtered out by the filter 17. The filtered cleansing liquid is then supplied into the inner tub 11, thus effectively preventing the wafer "w" from being polluted.

As described above, the apparatus for cleansing a semiconductor wafer according to the present invention is basically directed to disposing a foreign substance extraction tube on a boat on which a wafer is mounted and discharging the foreign substances removed from the wafer and the boat to the outside of the inner tub, thus preventing the wafer, which is being cleansed, from being polluted, whereby it is possible to increase the cleansing effects of the system.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. An apparatus for cleansing a semiconductor wafer, comprising:

an outer tub having a first cleansing liquid supply tube for supplying a cleansing liquid therethrough and a discharge tube for discharging the cleansing liquid therethrough;

an inner tub disposed within the outer tub;

a baffle plate disposed within the inner tub for distributing the cleansing liquid supplied to the semiconductor wafer;

a boat disposed on the baffle plate for mounting the semiconductor wafer;

a particle extraction tube disposed in the boat for extracting particles formed in the inner tub and for discharging the particles; and a second cleansing liquid supply tube for supplying the cleansing liquid to the particle extraction tube.

2. The apparatus of claim 1, wherein said particle extraction tube includes a plurality of particle receiving holes for supporting the semiconductor wafer and receiving the particles thereinto.

3. The apparatus of claim 1, wherein the particle extraction tube is connected to the second cleansing liquid supply tube, and the discharge tube.

4. The apparatus of claim 1, wherein said second cleansing liquid supply tube includes a valve for controlling a flowing speed of the cleansing liquid.

5. The apparatus of claim 1, wherein a first end of the second cleansing liquid supply tube is spaced apart from the first cleansing liquid supply tube, and a second end of the second cleansing liquid supply tube is connected to the particle extraction tube.

6. An apparatus for cleansing semiconductor wafers, comprising:

a tub having a first supply tube for supplying a cleansing liquid therethrough and a discharge tube for discharging the cleansing liquid;

a boat disposed in the tube for mounting the semiconductor wafers;

a particle extraction tube disposed in the boat for extracting particles formed in the tub and for discharging the particles; and a second supply tube for supplying the cleansing liquid to the particle extraction tube.

7. The apparatus of claim 6, further comprising a baffle plate in the tub for holding the boat thereon.

8. The apparatus of claim 6, wherein the particle extraction tube includes a plurality of particle receiving holes.

9. The apparatus of claim 8, wherein the plurality of particle receiving holes are used to support the semiconductor wafers thereon.

10. The apparatus of claim 6, wherein the particle extraction tube is connected to the second supply tube and the discharge tube.

11. The apparatus of claim 6, wherein the second supply tube includes a valve for controlling a flowing speed of the cleansing liquid.

* * * * *